（12） United States Patent
Du

(10) Patent No.: US 10,109,602 B2
(45) Date of Patent: Oct. 23, 2018

(54) PACKAGE INTEGRATED WITH A POWER SOURCE MODULE

(71) Applicant: Samsung Electronics Co., Ltd., Suwon-si, Gyeonggi-do (KR)

(72) Inventor: Maohua Du, Suzhou (CN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 89 days.

(21) Appl. No.: 15/279,973

(22) Filed: Sep. 29, 2016

(65) Prior Publication Data

US 2017/0271279 A1    Sep. 21, 2017

(30) Foreign Application Priority Data

Mar. 16, 2016    (CN) .......................... 2016 1 0148450

(51) Int. Cl.
| | | |
|---|---|---|
| *H01L 23/58* | (2006.01) | |
| *H01L 25/16* | (2006.01) | |

(Continued)

(52) U.S. Cl.
CPC ............ *H01L 23/58* (2013.01); *H01L 25/167* (2013.01); *H01L 31/046* (2014.12); *H02S 10/10* (2014.12); *H02S 20/00* (2013.01); *H02S 40/34* (2014.12); *H01L 2224/16225* (2013.01); *H01L 2224/32145* (2013.01); *H01L 2224/48091* (2013.01); *H01L 2224/73265* (2013.01); *H01L 2224/8592* (2013.01); *H01L 2924/15311* (2013.01)

(58) Field of Classification Search
CPC .. H01L 31/00–31/208; H01L 31/02008; H01L 31/02021; H01L 31/022441; H01L 25/16; H01L 25/167; H01L 23/58
See application file for complete search history.

(56) References Cited

U.S. PATENT DOCUMENTS

| | | |
|---|---|---|
| 7,248,482 B2 | 7/2007 | Asahi et al. |
| 7,948,067 B2 | 5/2011 | Fouquet et al. |

(Continued)

FOREIGN PATENT DOCUMENTS

| | | |
|---|---|---|
| CN | 1551719 A | 12/2004 |
| CN | 101777565 A | 7/2010 |

(Continued)

OTHER PUBLICATIONS

KR101099585 English translation.*
Chinese Office Action dated Jan. 4, 2018 issued in corresponding Chinese Application No. 201610148450.4.

*Primary Examiner* — Jose R Diaz
(74) *Attorney, Agent, or Firm* — Harness, Dickey & Pierce, P.L.C.

(57) ABSTRACT

A package integrated with a power source module may be provided. The package including a substrate having an upper surface and a lower surface, a chip on the upper surface of the substrate, a first power supply on the upper surface of the substrate, the first power supply at one side of the chip, an encapsulant encapsulating the chip and the first power supply, a second power supply on the encapsulant, the second power supply electrically connected with the substrate through a connection member, the connection member penetrating through the encapsulant may be provided.

14 Claims, 3 Drawing Sheets

(51) Int. Cl.
*H02S 10/10* (2014.01)
*H02S 40/34* (2014.01)
*H01L 31/046* (2014.01)
*H02S 20/00* (2014.01)

(56) References Cited

U.S. PATENT DOCUMENTS

| | | | |
|---|---|---|---|
| 8,637,349 B2 | 1/2014 | Jenson et al. | |
| 8,723,301 B2 | 5/2014 | Sasaki | |
| 8,809,078 B1 * | 8/2014 | Lau | H01L 31/18 |
| | | | 257/434 |
| 9,773,766 B2 | 9/2017 | Ye et al. | |
| 2006/0245308 A1 | 11/2006 | Macropoulos et al. | |
| 2010/0126549 A1 | 5/2010 | Ryu | |
| 2010/0230806 A1 | 9/2010 | Huang et al. | |
| 2010/0244585 A1 | 9/2010 | Tan et al. | |
| 2013/0277801 A1 | 10/2013 | Chen et al. | |
| 2014/0097513 A1 | 4/2014 | Lee | |

FOREIGN PATENT DOCUMENTS

| | | |
|---|---|---|
| CN | 103378074 A | 10/2013 |
| CN | 104064612 A | 9/2014 |
| CN | 104769713 A | 7/2015 |
| JP | 2008066672 A | 3/2008 |
| JP | 2013214593 A | 10/2013 |
| KR | 101080386 B1 | 11/2011 |
| KR | 101099585 B1 | 12/2011 |
| TW | 201041084 A | 11/2010 |

\* cited by examiner

PACKAGE INTEGRATED WITH A POWER SOURCE MODULE

CROSS-REFERENCE TO RELATED APPLICATION

This application claims under 35 U.S.C. § 119 priority to the benefit of Chinese Patent Application No. 201610148450.4, filed on Mar. 16, 2016, in the State Intellectual Property Office of China, the disclosure of which is incorporated herein in its entirety by reference.

BACKGROUND

1. Field

The present inventive concepts relate to the semiconductor packaging field, in particular, to semiconductor system packages integrated with a power source module.

2. Description of the Related Art

In conventional electronic products, a package, a SMT (Surface Mount Technology) plate and a battery constitute a standard system, and the package is connected with the battery through the SMT plate to be supplied with power so as to ensure running of the system. FIG. 1 illustrates a package in the prior art. As shown in FIG. 1, the package can be connected with the outside through solder balls in the bottom thereof and can be supplied with power by an external power source.

With development of the Internet of Things, not only mobile phones, but also the daily necessities (e.g., cups, toothbrush, and/or cloth) are being connected to each other. Thus the package is desired to be portable and/or to be smaller. However, conventional packages face difficulties in miniaturization because integration level of packages becomes increasingly high, but an independent power source is still desired to supply power.

SUMMARY

The present inventive concepts provide a package integrated with a power source module capable of achieving miniaturization of the package.

According to an example embodiment, a package may include a substrate having an upper surface and a lower surface, a chip on the upper surface of the substrate; a first power supply on the upper surface of the substrate, the first power supply at one side of the chip, an encapsulant encapsulating the chip and the first power supply, a second power supply on the encapsulant, the second power supply electrically connected with the substrate through a connection member, the connection member penetrating through the encapsulant.

According to an example embodiment, a semiconductor package may include a substrate having an upper surface and a lower surface, a semiconductor chip on the upper surface of the substrate, a first power supply on the upper surface of the substrate, the first power supply configured to supply power from an external power source, an encapsulant encapsulating the semiconductor chip and the first power supply, and a self-powered power supply on the encapsulation member, the self-powered power supply configured to supply power to the semiconductor chip via a conductive connection member penetrating through the encapsulant and the substrate.

According to the above description of the present inventive concepts, a package integrated with a power source module can be provided such that the package is enabled to be supplied with power by a solar energy module, which in configured to absorb sunshine when at outdoor, and to be supplied with power wirelessly by electromagnetic induction when at indoor, thereby achieving self-supply of power of the package, and finally achieving miniaturization of an entire electronic system.

BRIEF DESCRIPTION OF THE DRAWINGS

Additional features of the present inventive concepts will become more apparent by describing in detail example embodiments following with reference to the accompanying drawings in conjunction with example embodiments, in which.

DETAILED DESCRIPTION

Figure 1:
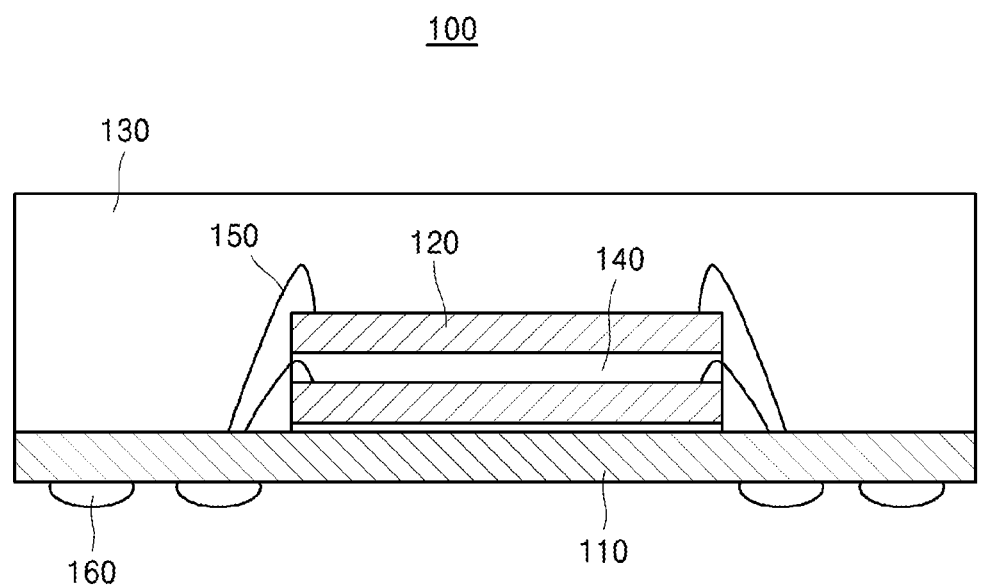
FIG. 1 is a cross-sectional view showing a package in the prior art.

Hereinafter, some example embodiments of the present inventive concepts will be described in detail with reference to the accompanying drawings.

In the drawings, the thickness of layers, films, panels, regions, etc., are exaggerated for clarity Like reference numerals designate like elements throughout the specification. It will be understood that when an element such as a layer, film, region, or substrate is referred to as being "on" another element, it may be directly on the other element or intervening elements may also be present. Alternatively, when an element is referred to as being directly on another element, there are no intervening elements present.

FIG. 1 is a cross-sectional view showing a package 100 in the prior art.

Referring to FIG. 1, the package 100 in the prior art includes a substrate 110, a chip 120 and an encapsulation member (interchangeably referred to as an encapsulant) 130. A plurality of chips 120 are sequentially attached on the substrate by an adhesive 140, and are electrically connected with the substrate by lead wires 150. The encapsulation member 130 is disposed on the substrate, and encapsulates the plurality of chips 120 and lead wires 150. As shown in FIG. 1, the package 100 in the prior art is connected with outside through a solder ball 160 in the bottom of the substrate, and is supplied with power by the external power source, and does not have a self-powered module.

As described above, if additional power supply module is desired, miniaturization in size of the package is limited. Thus, a package capable of overcoming such technical problems should be provided.

According to some example embodiments, a first power supply module (e.g. a magnetic resonance module) and a second power supply module (e.g. a solar module) are integrated in a package so that sunshine is able to be absorbed by the first power supply module when at outdoor so as to supply power to the package, and power is wirelessly provided by the second power supply module when at indoor. Thereby the package can be self powered, and miniaturization of the package may be achieved.

Figure 2:
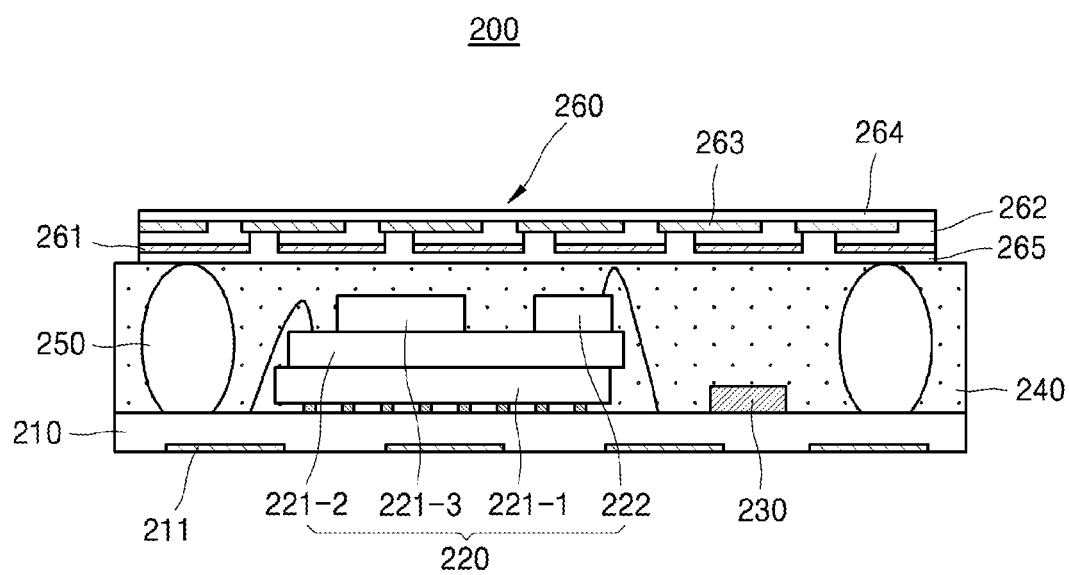
FIG. 2 is a schematic cross-sectional view showing a structure of a package according to an example embodiment.
Figure 3:
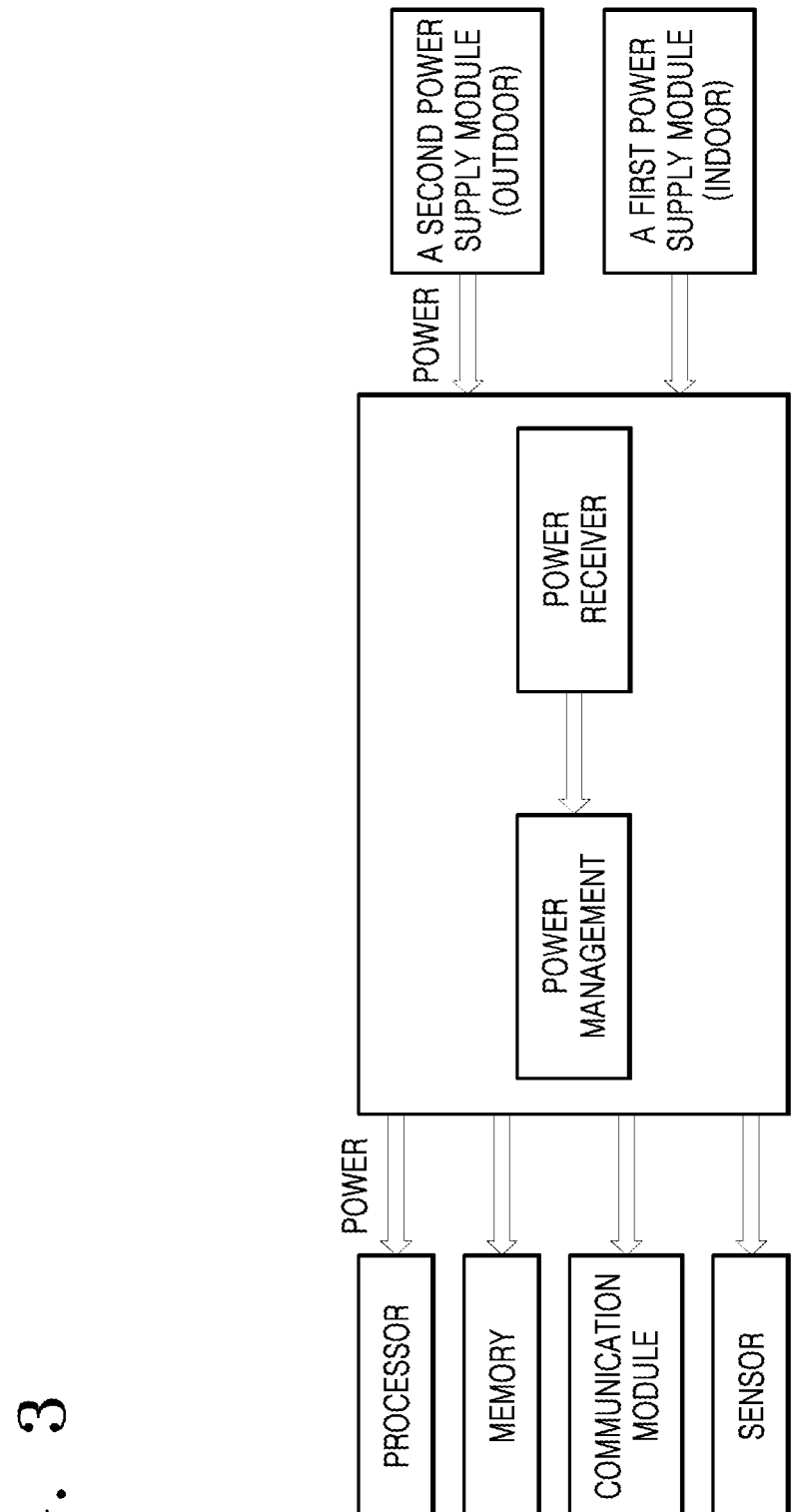
FIG. 3 is a principle diagram showing self supply of power of a package according to an example embodiment.
Figure 4:
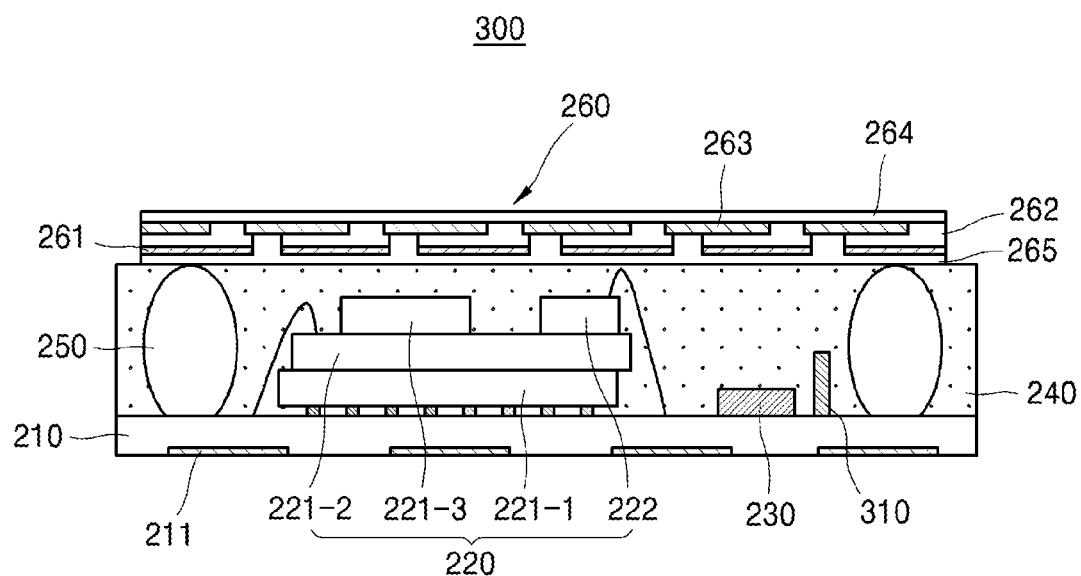
FIG. 4 is a schematic cross-sectional view showing a structure of a package according to an example embodiment.
Figure 5:
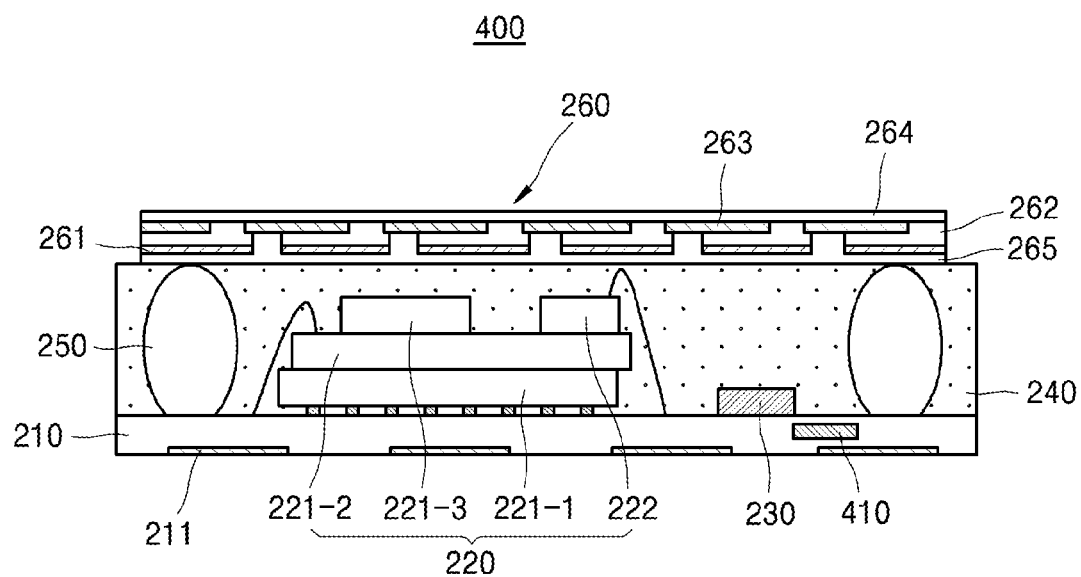
FIG. 5 is a schematic cross-sectional view showing a structure of a package according to an example embodiment.

FIG. 2 is a schematic cross-sectional view showing a structure of a package according to an example embodiment, FIG. 3 is a principle diagram showing self supply of power of a package according to an example embodiment, FIG. 4 is a schematic cross-sectional view showing a structure of a package according to an example embodiment, FIG. 5 is a schematic cross-sectional view showing a structure of a package according to an example embodiment.

Hereinafter, the structure of a package according to some example embodiments will be described in detail with reference to FIG. 2 to FIG. 5. However, the scope of the present inventive concepts is not limited to the disclosed example embodiments. Some example embodiments are provided so that the disclosure will be thorough and complete, and will more clearly convey the protection scope of the present inventive concepts to those skilled in the art.

FIG. 2 is a schematic cross-sectional view showing the structure of a package according to an example embodiment. As shown in FIG. 2, the package 200 according to an example embodiment may include a substrate 210, a chip 220, a first power supply module 230, an encapsulation member (interchangeably referred to as an encapsulant) 240, a connection member 250 and a second power supply module 260.

The substrate 210 has an upper surface and a lower surface. Moreover, the upper surface and the lower surface of the substrate 210 may be respectively disposed with pads (as shown in FIG. 2, a pad 211 disposed on the lower surface of the substrate 210). The pad (not shown) disposed on the upper surface of the substrate may be electrically connected with the chip 220 through a lead wire, and the pad (e.g. the pad 211) disposed on the lower surface of the substrate enables the entire package 200 to be connected to external connection terminals (not shown) through the pad 211.

The chip 220 is disposed on the upper surface of the substrate. The chip 220 may include a function chip 221 and a power processing chip 222. The function chip may include one or more of a processor, a memory, a communication module or a sensor, but the present inventive concepts are not limited thereto. In some example embodiments, the function chip 221 may include a processor 221-1, a memory 221-2 and a communication module 221-3 sequentially stacked on the substrate 210, and are connected with the substrate 210 through lead wires. The function chip 221 may perform various functions of the system, for example, processing data, storing data, and/or communicating with external devices. The power processing chip 222 may be stacked on the function chip 221, and may be connected with the substrate 210 through lead wires. For example, in some example embodiments, the power processing chip 222 may be disposed on the memory 221-2 included in the function chip 221. For example, in some example embodiments, the power processing chip 222 may be disposed by the communication module 221-3 included in the function chip 221. The power processing chip 222 may be used to receive energy, and may manage the energy to be distributed to respective elements included in the function chip 221. The area of the function chip 221 and the power processing chip 222 may be called as "a chip area".

The first power supply module 230 may be disposed on the upper surface of the substrate 210 (e.g. disposed on the upper surface of the substrate 210 by bonding), and may be arranged at one side of the chip 220. The first power supply module 230 may generate power by the electromagnetic resonance, thereby supplying power to the chip 220 by using the generated power. Thus, the first power supply module 230 according to an example embodiment may include one or more magnetic resonance elements, wherein each magnetic resonance element may include a magnetic thin film and a coil surrounding the magnetic thin film. When the first power supply module 230 is formed of the above configuration, the magnetic resonance element may generate power by coupling with a wireless power supply module (not shown) disposed an outside of the package 200 according to an example embodiment under the alternating magnetic field, thereby supplying power to the chip 220 (e.g. the power processing chip). However, the present inventive concepts are not limited thereto.

The encapsulation member 240 may be disposed on the substrate 210, and thus may encapsulate various elements (e.g. the chip 220, lead wires and the first power supply module 230 etc.) disposed on substrate 210. Moreover, the encapsulation member 240 may include an epoxy molding compound, and may have a flat surface. Furthermore, the encapsulation member 240 may be formed by a process, such as dispensing or molding, but the present inventive concepts are not limited thereto.

The second power supply module 260 may be disposed on the encapsulation member 240, and may supply power to the chip 220 by absorbing the external energy (e.g., solar energy) and converting the energy to electric energy. In this case, the second power supply module 260 may include a thin film solar energy module. According to an example embodiment, when the second power supply module 260 includes the a thin film solar energy module, the second power supply module 260 may include a metal pad layer 261, an amorphous silicon layer 262 having a PIN structure, a transparent conductive oxide layer—and a transparent thin film layer 264 sequentially stacked on the encapsulation member 240, and may be coupled onto the encapsulation member 240 by a anisotropic conductive adhesive 265, but the present inventive concepts are not limited thereto. Thus, the second power supply module 260 may have a structure achieving energy in other forms and converting the achieved energy into electrical energy. A connection member 250 may be disposed on the pad of the substrate 210, and may be disposed between the substrate 210 and the second power supply module 260. Moreover, the connection member 250 may be disposed in the encapsulation member 240, and may penetrate through the encapsulation member 240. In this case, the second power supply module 260 may be electrically connected with the connection member 250 (through the anisotropic conductive adhesive 265), and thus the power of the second power supply module 260 may be supplied to the chip 220 (e.g. the power processing chip 222) through the connection member 250. According to an example embodiment, the connection member 250 may be a plurality of metal pillars disposed around the chip 220, and the metal pillars may be made of a metal such as tin or copper, or an alloy thereof. However, the present inventive concepts are not limited thereto. The connection member 250 may be made of metal members of other structures, and the shape and the number of the connection member 250 are not limited.

The specific structure of a package according to an example embodiment has been described above in connection with an example embodiment. According to the above example embodiment, the package can be enabled to absorb energy of the environment (e.g. the solar energy) by the second power supply module in outdoor environment, and to convert energy of the environment to power so as to achieve self supply of power, moreover, the package can be enabled to provide power wirelessly by the electromagnetic conversion of the first power supply module in indoor environment.

Thus, the present inventive concepts eliminate a need of providing additional external independent power source(s), and thereby achieving miniaturization of the electronic system.

FIG. 3 is a principle diagram showing self supply of power of a package according to an example embodiment. Hereinafter, the principle diagram of self supply of power of a package 200 according to an embodiment will be described in combination with FIG. 3.

The self supply of power of the package 200 can include two kinds of situations, for example, working at outdoor and working at indoor.

By combining with FIG. 2 and FIG. 3, in outdoor environment, the second power supply module (e.g. the thin film solar module) 260 receives energy by absorbing the sunshine, and transmits the energy to the chip 220 (e.g. the power processing chip 222) through the connection member 250 (e.g. the metal pillars). Then, the chip 220 (e.g. the power processing chip 222) may manage energy, and may distribute the energy to other elements (e.g. the function chip 221 such as the processor 222-1, the memory 222-2, the communication module 222-3, and/or the sensor) in the chip 220, so as to support running of the elements.

Furthermore, in indoor environment, a first power supply module (the magnetic resonance element) 230 may generate power (e.g. under the alternating magnetic field) by wirelessly coupling with a power supply module (not shown), and transmit power to the chip 220 (e.g. the power processing chip 222), then the power can be distributed to other elements (e.g. the function chip 221 such as the processor 222-1, the memory 221-2 and the communication module 221-3, and/or the sensor) by the chip 220, so as to support running of the elements.

As described above, the package 200 according to this example embodiment can achieve self supply of power of the package by providing the second power supply module (e.g. the thin film solar module) in addition to the first power supply module (e.g. the magnetic resonance element). Thus, the electronic system may be miniaturized.

FIG. 4 is a schematic cross-sectional view showing a structure of a package 300 according to an example embodiment. Except for a passive device 310, the package 300 shown in FIG. 4 has the same structure as the package 200 shown in FIG. 2, and thus the repetitive description of the same members will be omitted.

The package 300 according to this example embodiment includes a substrate 210 having an upper surface and a lower surface, a chip 220 disposed on the upper surface of the substrate 210, a first power supply module 230 disposed on the upper surface of the substrate 210 and disposed at one side of the chip 220, an encapsulation member 240 encapsulating the chip 220 and the first power supply module 230, a second power supply module 260 disposed on the encapsulation member 240 and electrically connected with the substrate 210 through a connection member 250. Further, the connection member 250 may be disposed in the encapsulation member 240 and penetrate through the encapsulation member 240.

Furthermore, in the package 300 according to this example embodiment, a passive device 310 may further be disposed on the upper surface of the substrate 210. The passive device 310 may be a device such as a capacitor, a resistor, an inductor, or the like, and has a function of steadily providing power in the package.

FIG. 5 is a schematic cross-sectional view showing a structure of a package 400 according to an example embodiment. Except for the position which the passive device 410 is disposed, the package 400 shown in FIG. 5 has the same structure as the package 300 shown in FIG. 4, and thus the repetitive description of the same members will be omitted.

The package 400 according to this example embodiment includes a substrate 210 having an upper surface and a lower surface, a chip 220 disposed on the upper surface of the substrate 210, a first power supply module 230 disposed on the upper surface of the substrate 210 and disposed at one side of the chip 220, an encapsulation member 240 encapsulating the chip 220 and the first power supply module 230, a second power supply module 260 disposed on the encapsulation member 240 and electrically connected with the substrate 210 through connection member 250. Further, the connection member 250 may be disposed in the encapsulation member 240 and penetrate through the encapsulation member 240.

Furthermore, in the package 400 according to this example embodiment, a passive device 410 may further be disposed in (e.g., buried in) the substrate 210. The passive device 410 may be a device such as a capacitor, a resistor, an inductor or the like, and may function as steadily providing power in the package.

Some example embodiments of the present inventive concepts have been described with reference to the accompanying drawings. According to the disclosed example embodiments, in outdoor environment, the second power supply module may receive the external energy by absorbing the sunshine, convert such external energy to electric energy, and transmit electric energy to the chip and the passive device through the connection member and the substrate. The chip may manage and distribute the electric energy transmitted by the connection member, and thus achieving self supply of power, during which the passive device functions as a power (voltage) steadying device. Furthermore, in indoor environment, the first power supply module may generate power (e.g. generating current under the alternating magnetic field) by wireless coupling with a power supply module (not shown), and supply the generated power to the chip and the passive device, wherein the chip manages and distributes electric energy transmitted by the connection member. The passive device functions as a power steadying device.

The foregoing is illustrative of some example embodiments of the present inventive concepts and is not to be construed as limiting thereof. Although a few example embodiments have been described, those skilled in the art will readily appreciate that many modifications are possible in the example embodiments without materially departing from the novel teachings of the present inventive concepts.

What is claimed is:

1. A package comprising:
    a substrate having an upper surface and a lower surface;
    a chip on the upper surface of the substrate;
    a first power supply on the upper surface of the substrate, the first power supply at one side of the chip, the first power supply including a magnetic resonance element;
    an encapsulant encapsulating the chip and the first power supply; and
    a second power supply on the encapsulant, the second power supply electrically connected with the substrate through a connection member, the connection member penetrating through the encapsulant.

2. The package of claim 1, wherein the magnetic resonance element includes a magnetic thin film and a coil surrounding the magnetic thin film.

3. The package of claim 1, wherein the second power supply includes a thin film solar energy module.

4. The package of claim 1, wherein the connection member includes metal.

5. The package of claim 1, wherein the package further includes:
a passive device on the upper surface of the substrate.

6. The passive device of claim 5, wherein the passive device includes at least one of a capacitor, a resistor, or an inductor.

7. The package of claim 1, wherein the package further includes:
a passive device buried in the substrate.

8. The package of claim 1, wherein the chip includes:
at least one function chip and a power processing chip that are stacked on the upper surface of the substrate.

9. The package of claim 8, wherein the at least one function chip includes one or more of a processor, a memory, and a communication module.

10. A semiconductor package comprising:
a substrate having an upper surface and a lower surface;
a semiconductor chip on the upper surface of the substrate;
a first power supply on the upper surface of the substrate, the first power supply configured to supply power from an external power source, the first power supply including a magnetic resonance element;
an encapsulant encapsulating the semiconductor chip and the first power supply; and
a self-powered power supply on the encapsulation, the self-powered power supply configured to supply power to the semiconductor chip via a conductive connection member penetrating through the encapsulant and the substrate.

11. The semiconductor package of claim 10, wherein the magnetic resonance element includes a magnetic thin film and a coil surrounding the magnetic thin film.

12. The semiconductor package of claim 10, wherein the self-powered power supply includes a solar energy module.

13. The semiconductor package of claim 10, wherein the self-powered power supply includes a thin film solar energy module, and the thin film solar energy module includes an amorphous silicon layer with a PIN structure.

14. The semiconductor package of claim 10, wherein the conductive connection member includes metal.

* * * * *